United States Patent
Yamamoto et al.

(10) Patent No.: US 7,264,883 B2
(45) Date of Patent: Sep. 4, 2007

(54) HARD COATING FILM EXCELLENT IN ADHESION AND MANUFACTURING METHOD THEREOF

(75) Inventors: Kenji Yamamoto, Kobe (JP); Toshiki Sato, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 124 days.

(21) Appl. No.: 10/743,735

(22) Filed: Dec. 24, 2003

(65) Prior Publication Data

US 2004/0209125 A1    Oct. 21, 2004

(30) Foreign Application Priority Data

Dec. 27, 2002  (JP)  ............................. 2002-380486
Dec. 27, 2002  (JP)  ............................. 2002-380487

(51) Int. Cl.
*B23B 27/14*    (2006.01)
(52) U.S. Cl. ..................... 428/472; 428/469; 428/698; 428/704; 204/192.1; 204/192.15; 204/192.16
(58) Field of Classification Search ................ 428/469, 428/472, 698, 704; 204/192.1, 192.15, 192.16
See application file for complete search history.

(56) References Cited

U.S. PATENT DOCUMENTS

| 4,683,043 A | | 7/1987 | Melton et al. |
| 4,708,653 A | * | 11/1987 | Eichen et al. ............... 428/698 |
| 4,731,302 A | * | 3/1988 | Weissmantel et al. ...... 428/472 |
| 4,842,710 A | * | 6/1989 | Freller et al. .......... 204/192.38 |

(Continued)

FOREIGN PATENT DOCUMENTS

DE    2 018 662    12/1970

| DE | 148 349 | 5/1981 |
| DE | 155 826 | 7/1982 |
| EP | 0 136 161 B2 | 4/1985 |
| EP | 0 179 582 B1 | 4/1986 |
| EP | 0 892 861 B1 | 1/1999 |

(Continued)

OTHER PUBLICATIONS

T. Eckardt, et al., "Improving Tribological Properties of Sputtered Boron Carbide Coatings by Process Modifications", Hauzer Techno Coating News Letter, Apr. 17, 2001, pp. 1-15.

(Continued)

*Primary Examiner*—Archene Turner
(74) *Attorney, Agent, or Firm*—Oblon, Spivak, McClelland, Maier & Neustadt, P.C.

(57) ABSTRACT

A hard coating film of the present invention is formed on a substrate, and is a multilayer including at least the following layers (1) to (3). (1) A first layer on the substrate side comprising one or more metals selected from the group consisting of elements in Groups 4A, 5A, and 6A of the periodic table; (2) a B- and C-containing surface layer; and (3) a graded composition layer which is formed in a sandwiched manner between the first layer and the surface layer, and in which the content of B and C changes continuously or stepwise from the first layer side toward the surface layer side. Another hard coating film of the present invention has a cubic boron nitride film as its outermost surface layer; the cubic boron nitride film is stacked in a state of having been nucleated from a B- and N-containing layer; and the B- and N-containing layer has a ratio of N to B of 0.8 to 1 on a mole basis in at least the nucleation portion, and contains one or more elements selected from the group consisting of elements in Groups 4A, 5A, and 6A of the periodic table, and Si in a proportion of 0.02 to 0.1 on a mole basis. Such a configuration provides a hard coating film capable of being formed with good adhesion on the substrate surface of a cemented carbide, a high-speed steel, or the like.

15 Claims, 10 Drawing Sheets

U.S. PATENT DOCUMENTS

| | | | | |
|---|---|---|---|---|
| 4,892,791 | A | * | 1/1990 | Watanabe et al. ............ 428/698 |
| 5,490,911 | A | * | 2/1996 | Makowiecki et al. ..... 204/192.15 |
| 5,718,541 | A | * | 2/1998 | Bryant ......................... 407/119 |
| 6,517,249 | B1 | * | 2/2003 | Doll ............................. 384/492 |
| 6,593,015 | B1 | * | 7/2003 | Inspektor .................... 428/698 |

FOREIGN PATENT DOCUMENTS

| | | |
|---|---|---|
| EP | 1 038 044 B1 | 9/2000 |
| GB | 1 284 030 | 8/1972 |
| JP | 63-20446 | 1/1988 |
| JP | 63-239103 | 10/1988 |
| JP | 3-260061 | 11/1991 |
| JP | 4-57604 | 2/1992 |
| JP | 4-57605 | 2/1992 |
| JP | 2002-167205 | 6/2002 |

OTHER PUBLICATIONS

K. Yamamoto, et al., "Structural Features of Thick C-Boron Nitride Coating Deposited Via a Graded B-C-N Interlayer", Surface and Coatings Technology 142-144 (2001) pp. 881-888.

U.S. Appl. No. 10/743,735, filed Dec. 24, 2003, Yamamoto, et al.

U.S. Appl. No. 10/769,913, filed Feb. 3, 2004, Yamamoto, et al.

U.S. Appl. No. 10/807,332, filed Mar. 24, 2004, Yamamoto, et al.

* cited by examiner (No. 6)

(No. 7)

HARD COATING FILM EXCELLENT IN ADHESION AND MANUFACTURING METHOD THEREOF

BACKGROUND OF THE INVENTION

1. Field of the Invention

The present invention relates to a hard coating film to be coated on the surface of a member such as a cutting tool, a sliding member, or a die, and a manufacturing method thereof. More particularly, it relates to a hard coating film including a B—C system coating film or a cubic boron nitride film as the outermost surface layer, which is a hard coating film capable of being formed with good adhesion on the surface of the substrate of a cemented carbide, a high-speed tool steel, or the like, and a useful method for manufacturing such a hard coating film.

2. Description of the Related Art

A B- and C-containing coating film (hereinafter, may be referred to as a "B—C system coating film") has a high hardness (a Vickers hardness HV of about 3500), and is also excellent in heat resistance, as typified by boron carbide ($B_4C$). For this reason, the coating film has been studied to be applied to a cutting tool, a sliding member for use in a high-temperature environment, a die, or the like.

However, the B—C system coating film of boron carbide or the like is poor in adhesion to a cemented carbide (WC base cemented carbide) or a high-speed steel generally used as a material for a cutting tool or the like. For example, when the surface of such a material is coated with boron carbide, and the resulting coated material is applied to a cutting tool, coating film peeling unfavorably occurs at an early stage during use of the tool. Under such circumstances, various techniques have been proposed from the viewpoint of improving the adhesion to a cemented carbide or a high-speed steel.

As one of the techniques, a technique has been proposed in which, for example, a high-speed steel is used as a substrate, and a Ti layer is formed as an interlayer on the substrate surface, and then a B—C system coating film is formed on the interlayer by a sputtering process using a $B_4C$ target (see, e.g., Hauzer Techno Coating News Letter 17-4-2001). With this technique, Ti is formed as an interlayer, so that a Ti—B bond is formed between the B—C system coating film and the Ti layer, which enhances the adhesion of the B—C system coating film.

With the development of such a technique, it has been possible to more improve the adhesion than in the case where the B—C system coating film has been directly formed on the high-speed steel surface. However, the Ti—B bond involved in the adhesion is formed at only a part of the interface. As a result, it cannot be said that an adhesion sufficient enough for being applicable to a material for a cutting tool or the like has been achieved.

On the other hand, for the formation of a hard layer (external layer) of BxC (x=3.5 to 4.5) on the cemented carbide base metal surface, a proposal has been also made on a coating film configuration in which a C-rich graded texture layer of BxC (x=0.5 to 2), or a layer comprising a nitride, a carbide, or a carbonitride of Ti, Zr, Hf, or the like is formed as an internal layer (interlayer) (e.g., JP-A Nos. 57604/1992 and 57605/1992).

However, also with these techniques, the bonding region of the interlayer and the BxC (x=3.5 to 4.5) hard layer is only a part of the interface. As a result, it cannot be said that a sufficient adhesion has been achieved.

As a still other film, a cubic boron nitride film (hereinafter, may be abbreviated as a "cBN film") has a high hardness and is also excellent in heat resistance. For this reason, the film has been studied to be applied to a cutting tool, a sliding member for use in a high-temperature environment, a die, or the like.

However, the cBN film has a large film stress, which unfavorably results in poor adhesion to a cemented carbide (WC base cemented carbide) or a high-speed steel generally used as a material for a cutting tool or the like. For example, when the surface of such a material is coated with the cBN film, and the resulting coated material is applied to a cutting tool, coating film peeling unfavorably occurs at an early stage during use of the tool. Under such circumstances, various techniques have been proposed from the viewpoint of improving the adhesion to a cemented carbide or a high-speed steel.

From the viewpoint of relieving the film stress of the cBN film, a technique has been proposed in which the cBN coating film is allowed to contain therein one or more elements selected from the group consisting of the transition metals in Groups 4A, 5A, and 6A of the periodic table, Al, and Si (see, e.g., JP-A No. 167205/2002).

However, with this technique, it cannot be said that the film stress of the cBN film is sufficiently reduced. Accordingly, the adhesion remains as unsatisfactory as ever.

On the other hand, another technique has also been proposed, wherein an interlayer in which the content of B and N changes in a graded manner is formed on the substrate surface, and the interlayer is allowed to contain C therein, so that B—C and C—N bonds are precipitated in the interlayer, followed by a sputtering process using a $B_4C$ target, thereby to form a cBN system coating film on the interlayer (see, e.g., "Surf. Coat. Technol.", K. Yamamoto et al., 142-144, 881 (2001)).

With this technique, by achieving a higher hardness of the interlayer, the adhesion to the substrate is enhanced. However, the formation of the B—C bond or the C—N bond alone is insufficient for increasing the hardness of the interlayer. Further, the C—N bond is instable at high temperatures, and hence it decomposes by the temperature increase during use. As a result, unfavorably, the effects as high as expected are not achieved.

SUMMARY OF THE INVENTION

The present invention has been completed under such circumstances. It is therefore an object of the present invention to provide a hard coating film capable of being formed with good adhesion on the substrate of a cemented carbide, a high-speed steel, or the like, and a useful method for manufacturing such a hard coating film.

The hard coating film of the present invention, which can attain the foregoing object, is a hard coating film to be formed on a substrate. The gist of the present invention resides in that the hard coating film comprises stacked layers including at least the following layers (1) to (3):

(1) A first layer on the substrate side, comprising a layer of one or more metals selected from the group consisting of elements in Groups 4A, 5A, and 6A of the periodic table, or a layer of a nitride and/or a carbonitride of one or more metals selected from the group consisting of elements in Groups 4A, 5A, and 6A of the periodic table;

(2) A B- and C-containing surface layer; and (3) A graded composition layer which is formed in a sandwiched manner between the first layer and the surface layer, and has a thickness of 0.05 μm or more, and in which the content of B and C changes continuously or stepwise from the first layer side toward the surface layer side.

In the hard coating film of the present invention, when the first layer comprises one or more metals selected from the group consisting of elements in Groups 4A, 5A, and 6A of the periodic table, it is also useful that a layer of a nitride and/or a carbonitride of one or more metals selected from the group consisting of elements in Groups 4A, 5A, and 6A of the periodic table is further interposed between the first layer and the graded composition layer.

In each of the hard coating films, the graded composition layer preferably contains one or more elements selected from the group consisting of elements in Groups 4A, 5A, and 6A of the periodic table contained in the first layer as components other than B and C. In such a case, the content of these elements in the graded composition layer also changes continuously or stepwise in accordance with the continuous or stepwise change in the content of B and C. Further, in such a case, the bonds between the elements and B and/or C (at least any of B, C, and N when a nitride and/or carbonitride layer is stacked on the graded composition layer) are preferably contained. The presence of such bonds results in a further improvement in adhesion of the hard coating film.

In the hard coating film of the present invention, it is preferable to satisfy the following requirements: (a) the ratio of C to B in the surface layer is 0.1 to 0.3 on a mole basis; (b) the surface layer contains therein one or more elements selected from the group consisting of elements in Groups 4A, 5A, and 6A in the periodic table, Si, Al, and N in a proportion of 0.02 to 0.5 mol; and other requirements. By satisfying these requirements, it is possible to further improve the mechanical characteristics of the hard coating film.

On the other hand, for manufacturing the hard coating film as described above, the following procedure may be adopted. At least one target of one or more metals selected from the group consisting of elements in Groups 4A, 5A, and 6A of the periodic table or an alloy thereof, and at least one target containing B and C are arranged in the same vacuum chamber. Thus, a sputtering process is applied while rotating a substrate to form a hard coating film on the substrate surface.

Whereas, the hard coating film of the present invention, capable of achieving the foregoing object, has the gist in the following points: it has a cubic boron nitride film as its outermost surface layer; the cubic boron nitride film is stacked in a state of having been nucleated from a B- and N-containing layer; and the B- and N-containing layer has a ratio of N to B of 0.8 to 1 on a mole basis in at least the nucleation portion, and contains one or more elements selected from the group consisting of elements in Groups 4A, 5A, and 6A of the periodic table, and Si in a proportion of 0.02 to 0.1 on a mole basis.

In the hard coating film of the present invention, it is preferable to satisfy the following requirements: (a) the B- and N-containing layer contains therein the bonds of one or more elements selected from the group consisting of elements in Groups 4A, 5A, and 6A of the periodic table, and Si, with B and/or N; and (b) the B- and N-containing layer contains C in a proportion of 0.2 or less on a mole basis at least in the nucleation portion; and other requirements.

As the hard coating film of the present invention, a film having a configuration of the foregoing structure is directly formed on the substrate surface, and thereby exerts the effects. If required, it is also acceptable that a B- and C-containing film is formed on the substrate side, and that the hard coating film is formed on this film. A film having the multilayered structure comprising the layers (1) to (3) is preferably used as the B- and C-containing film on the substrate side.

On the other hand, for manufacturing the hard coating film as described above, the following procedure maybe adopted. At least one target of one or more metals selected from the group consisting of elements in Groups 4A, 5A, and 6A of the periodic table, and Si, or an alloy thereof, and at least one target containing B and Care arranged in the same vacuum chamber. Thus, a sputtering process is applied to form a hard coating film on the substrate surface.

The present invention is constituted as described above, and can implement a hard coating film capable of being formed with good adhesion on the substrate of a cemented carbide, a high-speed steel, or the like.

DETAILED DESCRIPTION OF THE PREFERRED EMBODIMENTS

Figure 1:
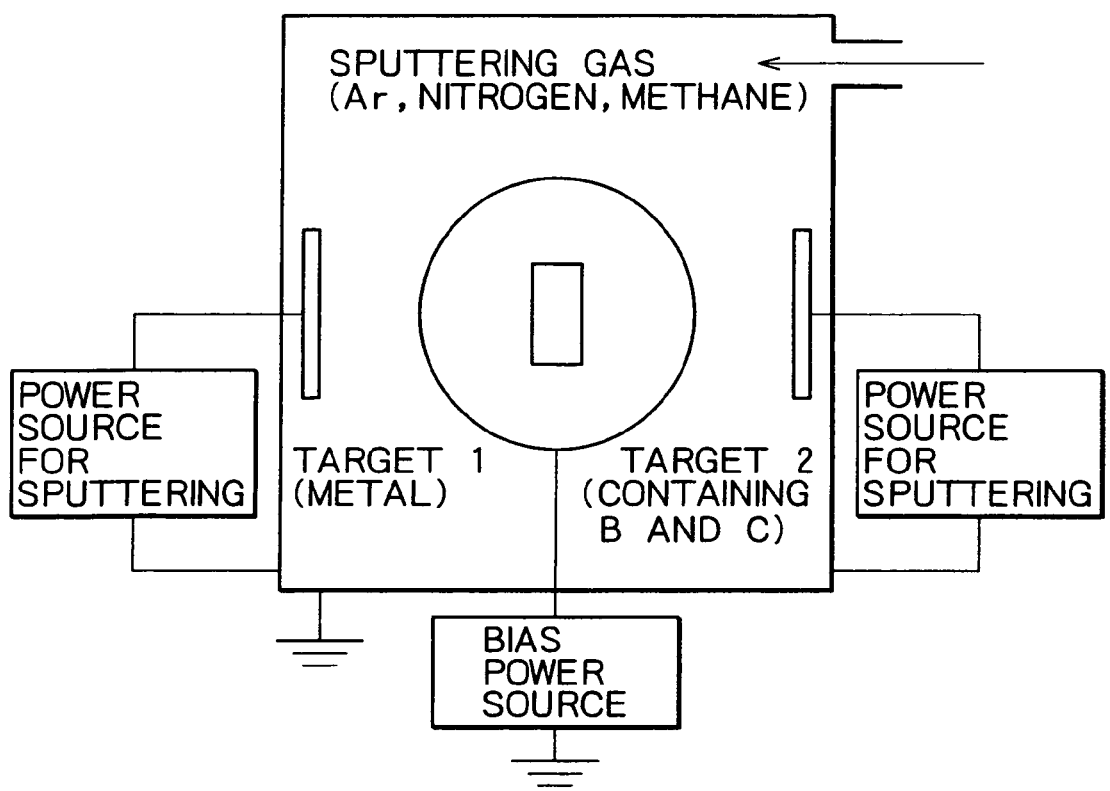
FIG. 1 is a plan view schematically showing an outline of a sputtering film deposition apparatus used in the present invention.
Figure 2:
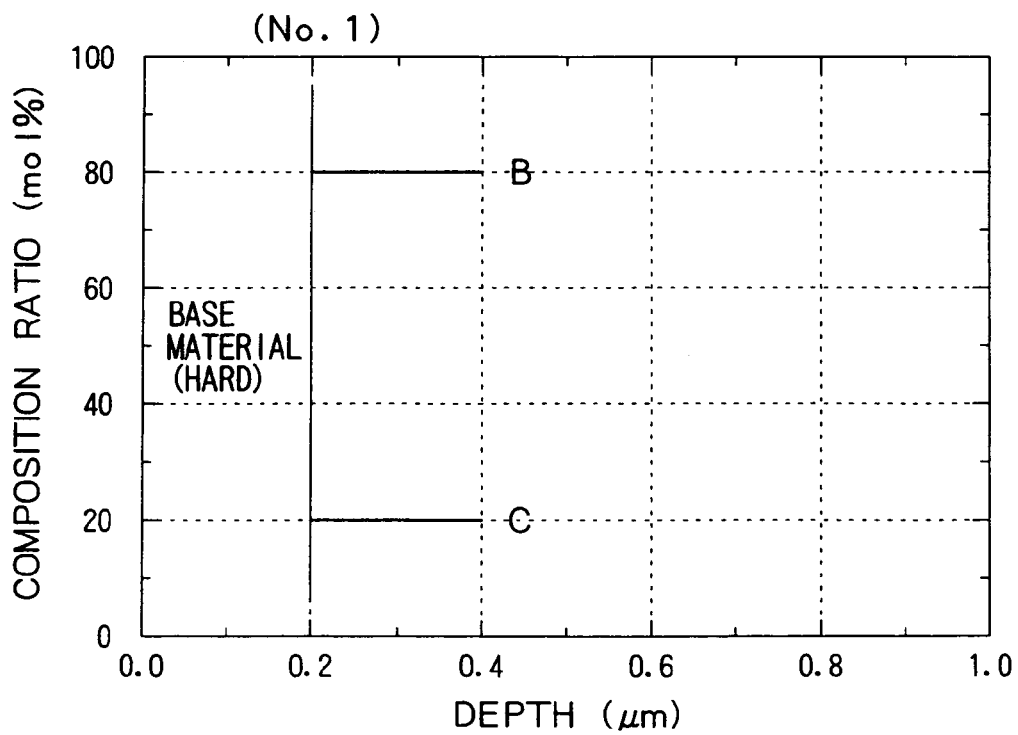
FIG. 2 is a depth profile schematically showing the SIMS analysis results in a hard coating film of No. 1 of Table 1.
Figure 3:
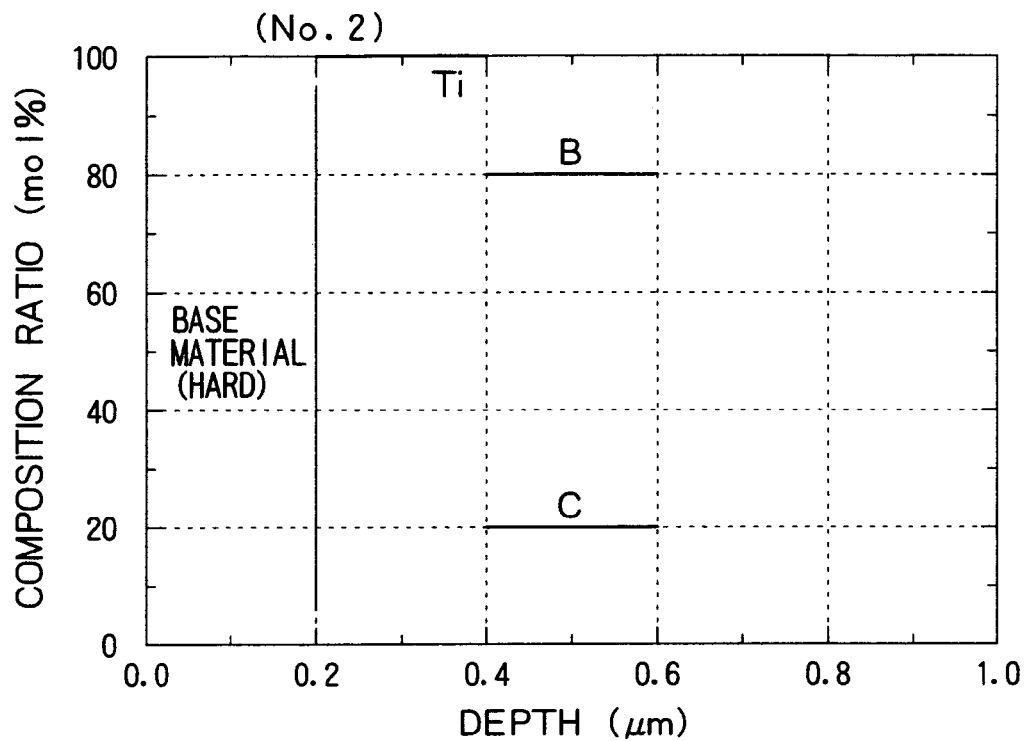
FIG. 3 is a depth profile schematically showing the SIMS analysis results in a hard coating film of No. 2 of Table 1.

First, a hard coating film of a first invention will be described.

It has been conceivable that the reason why each interlayer proposed so far is insufficient in adhesion to a B—C system coating film formed as a surface layer is largely caused by the difference in mechanical characteristics between the interlayer and the surface layer. The present inventors have continuously conducted a study from the viewpoint that it would be possible to implement a hard coating film having a favorable adhesion if such a difference in mechanical characteristics are corrected.

As a result, the present inventors have found as follows. Between a first layer on the substrate side, comprising one or more metals selected from the group consisting of the elements (Ti, Zr, Hf, V, Nb, Ta, Cr, Mo, and W) in Groups 4A, 5A, and 6A of the periodic table, and a B- and C-containing surface layer, a B- and C-containing layer is formed. In addition, the content of B and C in this layer is controlled such that the composition gets closer to the composition of the surface layer toward the surface side as a graded composition continuously or stepwise changing from the first layer side toward the surface layer side. As a result, high adhesion is achieved, leading to the completion of the present invention.

When a boron carbide film is formed directly on a metal Ti interlayer, the metal Ti and the boron carbide film are largely different from each other in mechanical characteristics such as hardness and Young's modulus, and hence the upper layer and the lower layer undergo largely different deformation behaviors under an external stress during sliding or the like. Accordingly, peeling at the interface tends to occur. In contrast, as in the present invention, a graded composition layer is interposed between the surface layer and the metal layer (first layer), and controlled so as to change in the mechanical characteristics continuously or stepwise. As a result, an interface does not substantially exist. For this reason, the hard coating film becomes likely to follow its deformation behavior under an external stress, so that peeling of the film becomes less likely to occur.

It does not matter whether the content of B and C changes continuously, or changes intermittently (changes stepwise) in some portions in the graded composition layer. Further, in the graded composition layer, it does not matter if the content of B and C changes while keeping the ratio of the B content and the C content constant, or if the B content and the C content individually change. It is essential only that the composition gets closer in any manner to the composition of the surface layer toward the surface side in the graded composition layer.

When the external stress is under more extreme conditions, on the substrate surface, a metal nitride or carbonitride layer which is harder than the substrate (a layer of a nitride and/or a carbonitride of one or more metals selected from the group consisting of elements in Groups 4A, 5A, and 6A of the periodic table: hereinafter, may be referred to as "a carbide/carbonitride layer") is formed (namely, a carbide/carbonitride layer is provided in place of a metal first layer) As a result, the mechanical characteristics become more close to each other, and continuously change, so that the durability against an external stress increases. Alternatively, when the adhesion between the metal nitride and the substrate is poor, it is also useful to adopt a configuration in which a metal layer is further provided between the substrate and the carbide/carbonitride layer (namely, a configuration in which a carbide/carbonitride layer is interposed between the metal first layer and the graded composition layer).

In the hard coating film of the present invention, the metal layer (the first layer) and the graded composition layer substantially contain metallic elements, and B and C (or B, C, and N when a nitride/carbonitride layer is formed). However, the metallic elements are not present in simple metal forms, but desirably have chemical bonds with B and C (or at least any of B, C, and N).

Figure 4:
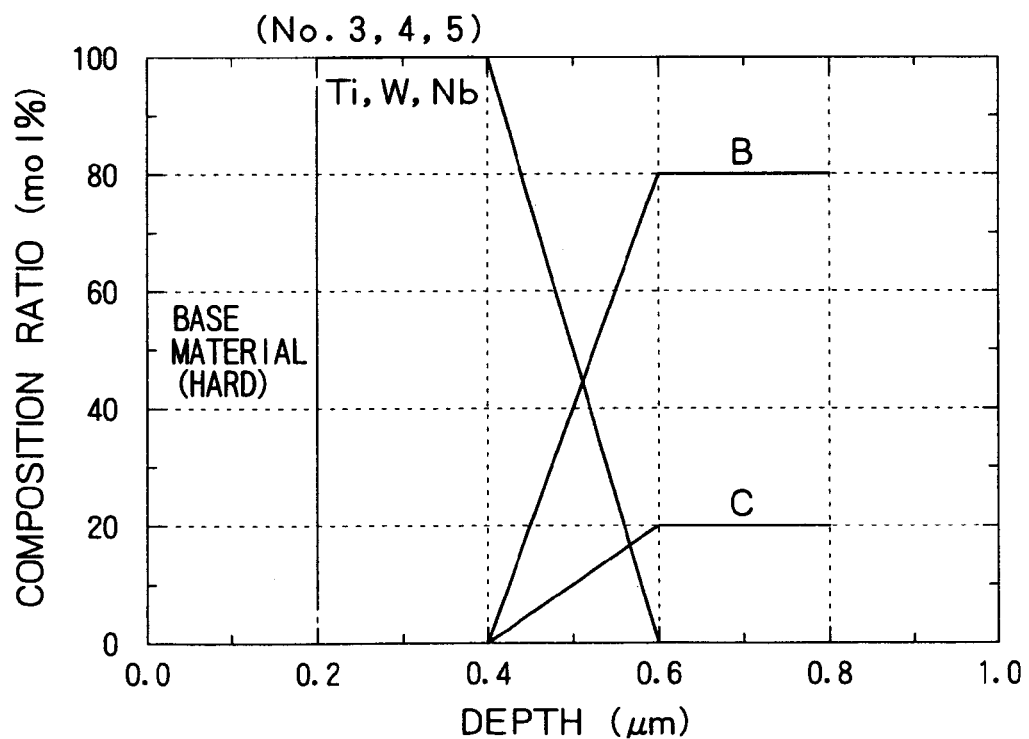
FIG. 4 is a depth profile schematically showing the SIMS analysis results in hard coating films of Nos. 3 to 5 of Table 1.
Figure 5:
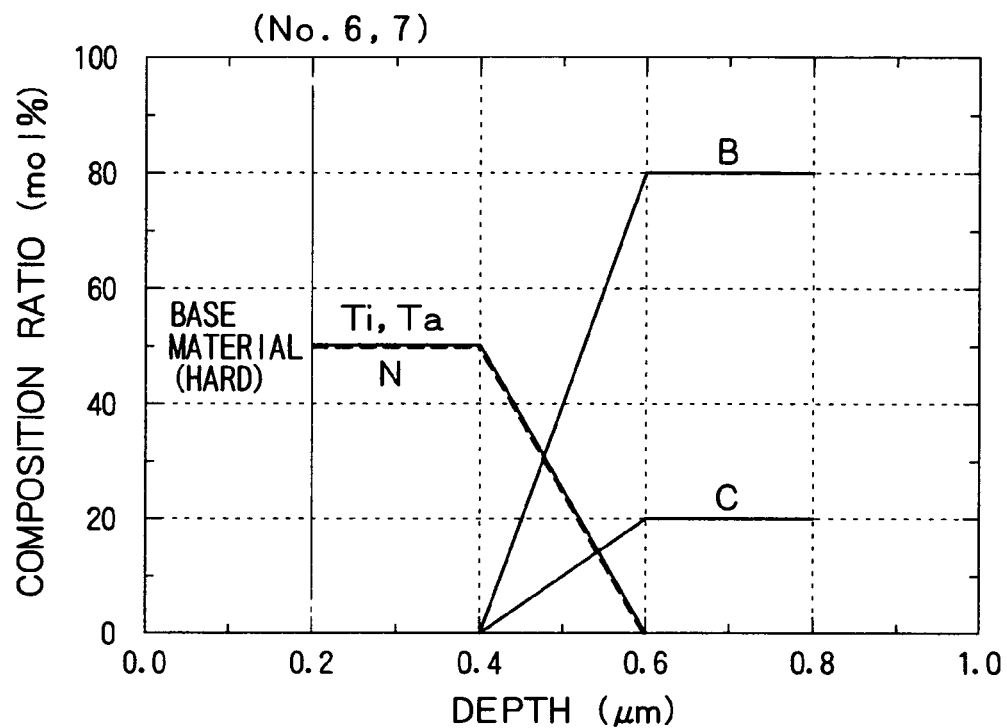
FIG. 5 is a depth profile schematically showing the SIMS analysis results in hard coating films of Nos. 6 and 7 of Table 1.

The proportion of the chemical bonds is calculated in the following manner. The composition ratios of the metallic elements, and B, C, and N at a given point in the graded layer are compared with each other. It is then determined which of the metallic elements, and B, C, and N are present in excess amounts based on the composition ratio of B, C, and N compounds formed by the respective metallic elements. Then, the proportion of the chemical bonds is defined as the proportion of B, C, and N combining with the metallic elements in the contained B, C, and N when the metallic elements are present in excess amounts. Contrarily, it is defined as the proportion of the metallic elements combining with B, C, and N in the contained metallic elements when the metallic elements are present in an amount falling short of the composition ratio. For example, for the coating film composition shown in FIG. 4 described later, Ti forms a stoichiometric compound of $TiB_2$ or Tic. Therefore, the proportion of bonds is defined by Ti when Ti is smaller in amount than in the composition of $Ti_2(B_2C)$ (metal: B, C=2:3). Whereas, it is defined as the proportion of bonds of B and C for the larger Ti amount than that. The B- and C-rich portion may become a soft coating film according to the composition ratios of B and C, which reduces the hardness of the graded layer portion, i.e., which adversely affects the adhesion thereof. For this reason, it is desirable that particularly the metallic elements added to the B- and C-rich portion out of the portions defined above respectively form bonds with B and C (or N) to cause an increase in hardness of the portion. Incidentally, it is desirable that, the proportion of the chemical bonds is preferably 50% or more, more preferably 80% or more, and further preferably 90% or more (the method of forming the bonds will be described later).

The elements in Groups 4A, 5A, and 6A of the periodic table are the elements all of which each combine with B, C, N, or the like to form a hard compound. The bonds thereof are precipitated in the graded composition layer, so that the hardness of the graded composition layer portion increases, resulting in an increase in strength. As a result, peeling becomes less likely to occur. Whereas, the metallic element content decreases with an increase in the content of B and C in the graded composition layer. Therefore, the proportion of the bonds continuously decreases from the substrate toward the surface direction. Incidentally, out of the elements in Groups 4A, 5A, and 6A of the periodic table, Ti, Nb, Ta, and W are preferred from the viewpoint of forming higher hardness compounds (carbide, boride, and nitride).

The B- and C-containing surface layer is basically the portion serving as the uppermost layer. The ratio of C to B in this layer is preferably 0.1 to 0.3 on a mole basis. When the ratio of C to B falls within the foregoing range, the hardness of the surface layer is maximized, resulting in a film preferable for a cutting tool or a wear resistant sliding member. When the ratio becomes less than 0.1 on a mole basis, amorphous B which does not combine with C is precipitated, resulting in a decrease in hardness. Whereas, when the molar ratio exceeds 0.3, amorphous C which does not combine with B is precipitated, resulting in a reduction in hardness and a degradation in heat resistance (C tends to be oxidized). A more preferred molar ratio falls within a range of 0.15 to 0.25.

It is also useful that the surface layer contains, other than the elements in Groups 4A, 5A, and 6A of the periodic table, one or more elements selected from the group consisting of Si, Al, and N in a proportion of 0.02 to 0.5 mol. By allowing the surface layer to contain these elements, compounds of these elements and B or C are formed, which allows the formation of a coating film which is higher in hardness and excellent in wear resistance. In particular, by allowing the surface layer to contain N, effectively, it is possible to form cubic boron nitride (cBN) which is very high in hardness. When the content of these elements is less than 0.02 by molar ratio, the foregoing effects are not exerted. Whereas, when it exceeds 0.5, metal components which do not combine with B and C are precipitated, resulting in a reduction in hardness.

For implementing the configuration of the hard coating film of the present invention, the following procedure may be adopted. At least one target of one or more metals selected from the group consisting of elements in Groups 4A, 5A, and 6A of the periodic table or an alloy thereof, and at least one target containing B and C are arranged in the same vacuum chamber. Thus, a sputtering process is applied while rotating a substrate to form a hard coating film on the substrate surface. By adopting the configuration, it is possible to form a film with a structure of first layer/(metal nitride/carbonitride layer)/graded composition layer/surface layer, or first layer/graded composition layer/(metal nitride/ carbonitride layer)/surface layer without breaking the vacuum. This allows the implementation of a hard coating film more excellent in adhesion.

In the film formation with the sputtering process, the electric power to be applied to each of the metal or alloy target and the B- and C-containing target is changed continuously or stepwise in time. As a result, it is possible to implement a graded composition layer in which the content of B and C changes continuously or stepwise from the first layer side toward the surface layer side.

Whereas, the process to be applied in the foregoing manufacturing method is basically a sputtering process. From the viewpoint of forming a bond between one or more elements selected from the group consisting of elements in Groups 4A, 5A, and 6A of the periodic table, and at least any of B, C, and N, an unbalanced magnetron sputtering process (UBMS process) is preferably applied. With the UBMS process, the balance of the magnetic field to be applied to the target is intentionally disturbed, so that the amount of ions incident upon the substrate is increased. With such a process, a large amount of ionized elements are made incident upon the substrate, which facilitates the formation of the foregoing bonds.

Each thickness of the first layer (metal layer), the nitride/ carbonitride layer, the graded composition layer, and the like in the hard coating film of the present invention preferably falls within the range of 0.05 to 1 µm. When each thickness of these layers is less than 0.05 µm, the adhesion improving effects are difficult to achieve. Whereas, even when it exceeds 1 µm, not only the adhesion improving effects are saturated, but also the processing time increases, and other practical disadvantages are caused. Each preferred thickness of these layers is about 0.1 to 0.5 µm.

Incidentally, in the hard coating film of the present invention, as described in connection with a second invention later, it is also possible to further form a BN coating film on the surface layer. When a high hardness cBN (cubic) coating film is formed, it is possible to obtain excellent wear resistance and oxidation resistance. Whereas, when an hBN (hexagonal) coating film is formed, it is possible to obtain excellent lubricity (low coefficient of friction) and oxidation resistance.

Whereas, it is also useful that the B- and C-containing surface layer (or, a BN coating film, formed, if required) in accordance with the present invention is formed on a layer comprising a compound of one or more elements selected from the group consisting of elements in Groups 4A, 5A, and 6A of the periodic table, and Al and Si, and one or more selected from B, C, N, and O (i.e., with a compound layer as an underlayer). As a result, the hard coating film can be further improved in wear resistance, and becomes preferable for uses requiring wear resistance, such as for use with cutting tools.

The substrates for use in the present invention are not limited to the foregoing cemented carbides and high-speed steels. For example, cermets, ceramics, and the like are also applicable. The hard coating film of the present invention can also be formed with good adhesion to such materials.

Next, a hard coating film of a second invention will be described.

With the adhesion improving techniques proposed so far, by allowing the B- and N-containing graded composition interlayer to contain C therein, B—C and C—N bonds are precipitated in the interlayer, resulting in an increase in hardness. This improves the adhesion. However, it cannot be said that sufficient adhesion has been achieved with these techniques.

The present inventors have continuously conducted a study from the viewpoint of solving such a problem in the related art. As a result, they found as follows. At least a B-/N-containing portion for effecting the nucleation of cBN (hereinafter, referred to as a "nucleation portion") is allowed to contain metallic elements forming stable and high hardness bonds with B and N. As a result, the hardness of the B- and N-containing portion is still further increased, and the adhesion is largely improved. Thus, the present invention was completed. Incidentally, the term "nucleation portion" denotes the portion in which crystals having a cBN (cubic) structure have been precipitated from the inside of the layer having an hBN (hexagonal) structure. It denotes the portion capable of being subjected to transmission electron microscope (TEM) observation, or observation and identification by infrared spectroscopy, or the like. In the hard coating film of the present invention, a cBN film is stacked in a state of having grown from such a nucleation portion.

Whereas, as the metallic elements, mention may be made of the elements (Ti, Zr, Hf, V, Nb, Ta, Cr, Mo, and W) in Groups 4A, 5A, and 6A of the periodic table, and Si. The inclusion of one, or two or more of these allows the effects to be exerted. However, the content thereof is required to be 0.1 or less by molar ratio. Although the detailed reason is uncertain, it is as follows. When the content of the metallic elements exceeds 0.1 by molar ratio, the nucleation of cBN is inhibited. Therefore, the content is desirably set at 0.07 or less by molar ratio. Out of the metallic elements, Ti, Zr, Nb, Ta, Cr, Mo, W, and Si are preferred from the viewpoint of forming higher hardness bonds with B and N.

Incidentally, as apparent from the foregoing gist, the B- and N-containing layer contains therein bonds between one or more elements selected from the group consisting of elements in Groups 4A, 5A, and 6A of the periodic table, and Si, and B and/or N.

On the other hand, when the content of the metallic elements is less than 0.02 by molar ratio, the effects of the inclusion of the metallic elements are reduced, and hence it becomes impossible to enhance the hardness. The more preferred lower limit of the metallic element content is 0.04 by molar ratio.

In order for the cBN phase to be precipitated., the ratio of N to B in the cBN film is also required to be controlled within an appropriate range. At least in the nucleation portion, the ratio of N to B is required to be controlled within a range of 0.8 to 1 by molar ratio. After the nucleation of cBN, it is possible to achieve the increase in hardness of the layer (surface layer) by the hardness of the cBN phase even if no metallic element is present. For this reason, the inclusion of the metallic elements basically becomes unnecessary. However, the inclusion of the metallic elements is also useful for the portions other than the nucleation portion according to the intended use.

It is also useful that the B- and N-containing layer contains therein C in a proportion of 0.2 or less on a mole basis at least in the nucleation portion. As a result, metal-C bonds are precipitated between the metallic elements contained at the same time and C. This allows the hardness to be still more increased. Further, when the metallic elements are contained, the metal-C bonds are more likely to be formed than B—C or C—N bonds for C. Accordingly, an effect is also exerted such that precipitation of instable C—N bonds is inhibited. However, when the C content exceeds 0.2 by molar ratio, C—N bonds tend to be precipitated. For this reason, the C content is preferably set at 0.2 or less. More preferably, it is set at the same level as the content of the metallic elements, and it is 0.1 or less by molar ratio.

As the hard coating film of the present invention, a film having a configuration of the foregoing structure is directly formed on the substrate surface, and thereby exerts the effects. If required, it is also acceptable that a B- and C-containing film is formed on the substrate side, and that the hard coating film of the present invention is formed on this film. As the B- and C-containing film herein used, mention may be typically made of a $B_4C$ film. From the viewpoint of improving the adhesion between this film and the cBN film as the outermost surface layer, it is also useful that the B- and N-containing layer is allowed to contain C, and is a graded composition layer of which the composition gets closer to the respective compositions of both the layers toward the $B_4C$ film and the cBN film.

Whereas, in the case where the $B_4C$ film is formed, by adopting the configuration as in the first invention, it is possible to improve the adhesion between the substrate and the $B_4C$ film when a substrate inferior in adhesion to the $B_4C$ film (e.g., a cemented carbide or a high-speed steel) is used. Thus, by adopting a configuration in which the $B_4C$ film of the first invention is formed on the substrate, and the cBN film of the second invention is formed thereon, it becomes possible to implement a hard coating film higher in adhesion.

For implementing the configuration of the hard coating film of the present invention, the following procedure may be adopted. At least one target of one or more metals selected from the group consisting of elements in Groups 4A, 5A, and 6A of the periodic table, and Si, or an alloy thereof, and at least one target containing B and C are arranged in the same vacuum chamber. Thus, a sputtering process is applied to form a hard coating film on the substrate surface. By adopting such a configuration, it is possible to form films with various film structures without breaking the vacuum. This allows the implementation of a hard coating film more excellent in adhesion.

The thickness of the B- and N-containing layer in the hard coating film of the present invention preferably falls within the range of 0.05 to 2 μm. When the thickness of this layer is less than 0.05 μm, the adhesion improving effects are low. Whereas, even when it exceeds 2 μm, the adhesion improving effects are saturated. The more preferred thickness of this layer is about 0.1 to 0.5 μm. The thickness of the outermost surface layer is properly in the range of 0.2 to 5 μm.

Incidentally, it is also useful that the hard coating film in accordance with the present invention is formed on a layer comprising a compound of one or more elements selected from the group consisting of elements in Groups 4A, 5A, and 6A of the periodic table, and Al and Si, and one or more selected from B, C, N, and O (i.e., with a compound layer as an underlayer) As a result, the hard coating film can be further improved in wear resistance, and becomes preferable for uses requiring wear resistance, such as for use with cutting tools. Whereas, the substrates for use in the present invention are not limited to the foregoing cemented carbides and high-speed steels. For example, cermets, ceramics, and the like are also applicable. The hard coating film of the present invention can also be formed with good adhesion to such materials.

Below, the present invention will be described in more details by way of examples. However, the following examples should not be construed as limiting the scope of the invention. The present invention can be practiced with appropriate modification within a scope not departing from the gist described above or later, any of which is included in the technical range of the present invention.

EXAMPLE 1

FIG. 1 is a plan view schematically showing an outline of a sputtering film deposition apparatus. The film deposition apparatus has two power sources for sputtering. A target 1 of one or more metals selected from the group consisting of elements in Groups 4A, 5A, and 6A of the periodic table, and a target 2 comprising boron carbide ($B_4C$) or B are set therein. Thus, a sputtering gas is introduced into a vacuum chamber while rotating a substrate (a material to be treated) by a table to deposit a film.

Various hard coating films were formed by means of the film deposition apparatus shown in FIG. 1. At this step, a mirror-polished cemented carbide substrate was used as a substrate for film deposition. For the deposition of a metal layer (first layer), an electric power was applied only to the metal target 1, and as a sputtering gas, Ar was used. For forming the nitride, carbide, and carbonitride layers, a mixed gas of Ar and nitrogen, a mixed gas of Ar and carbon, and a mixed gas of Ar, nitrogen, and methane were used, respectively.

After the formation of the metal layer, the electric power to the boron carbide target 2 was increased in a graded manner, and the electric power to the metal target 1 was decreased in a graded manner. As a result, a graded composition layer was manufactured. Whereas, when the graded composition layer was manufactured on a nitride layer, the electric power to the metal target 1 was decreased, and the ratio of a nitrogen gas to an Ar gas was also decreased in a graded manner. When the graded composition layer was manufactured on a carbide layer, the electric power to the metal target 1 was decreased, and the ratio of a methane gas to an Ar gas was also decreased in a graded manner. The electric power inputted to each of the targets 1 and 2 was 1.5 kW at the maximum, and the pressure for film deposition was 0.6 Pa in terms of total pressure.

Whereas, the ratio of nitrogen/Ar, or methane/Ar was controlled within a range of 0 to 0.5 according to the intended purpose. The voltage to be applied to the substrate was set constant at −100 V. The substrate temperature was controlled between 200 to 400° C. The thicknesses were set at about 0.2 to 0.4 μm for the metal layer and the carbonitride layer, about 0.2 to 0.4 μm for the graded composition layer, and 2 to 3 μm for the surface layer.

Figure 6:
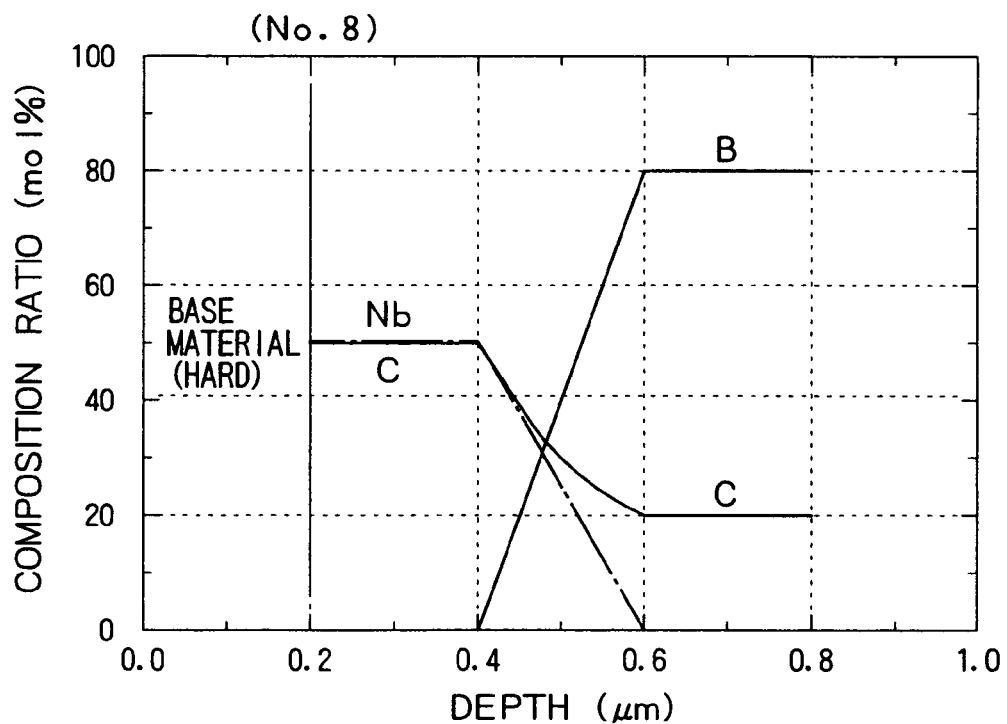
FIG. 6 is a depth profile showing the SIMS analysis results in a hard coating film of No. 8 of Table 1.
Figure 7:
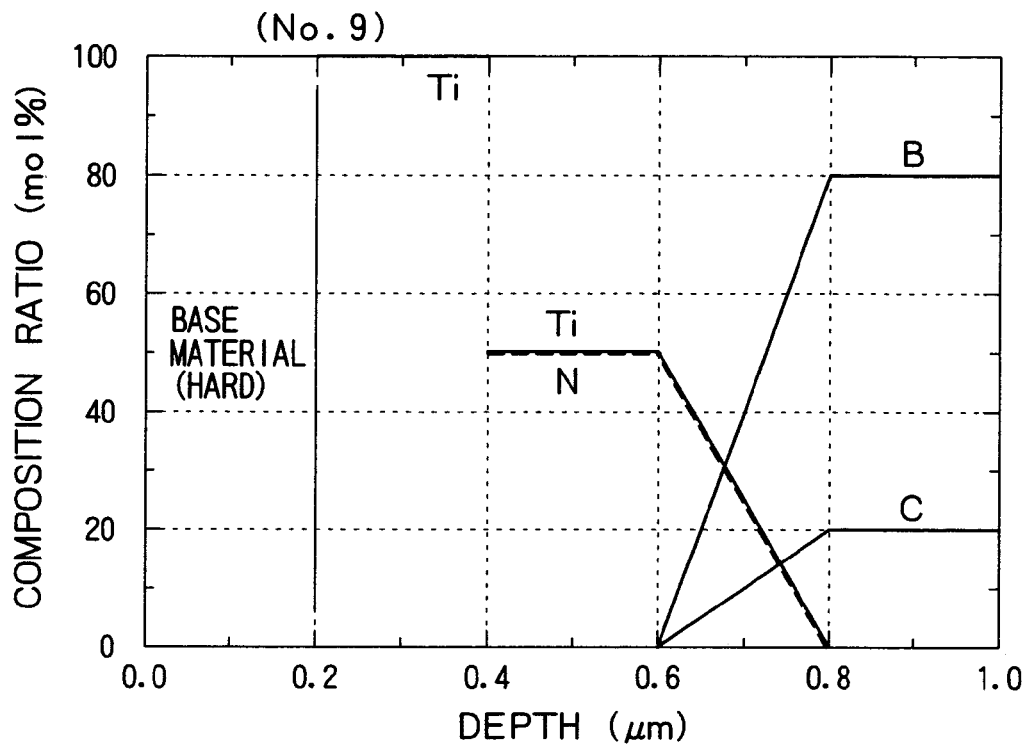
FIG. 7 is a depth profile schematically showing the SIMS analysis results in a hard coating film of No. 9 of Table 1.
Figure 8:
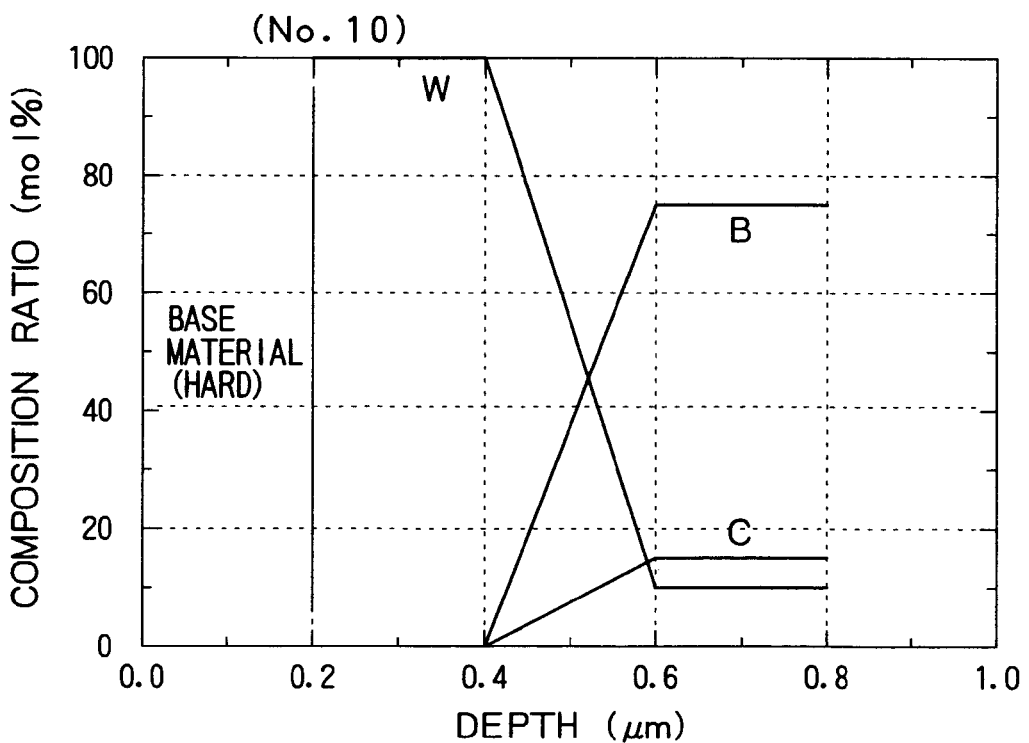
FIG. 8 is a depth profile schematically showing the SIMS analysis results in a hard coating film of No. 10 of Table 1.
Figure 9:
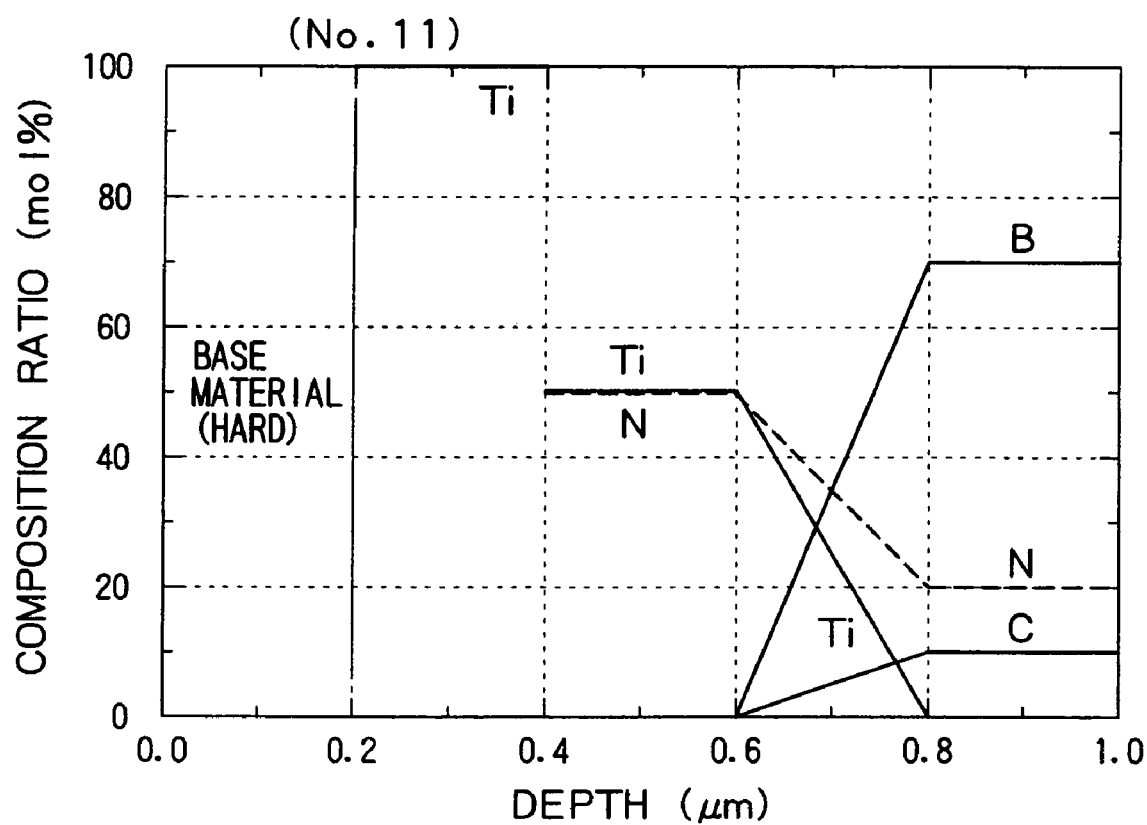
FIG. 9 is a depth profile schematically showing the SIMS analysis results in a hard coating film of No. 11 of Table 1.
Figure 10:
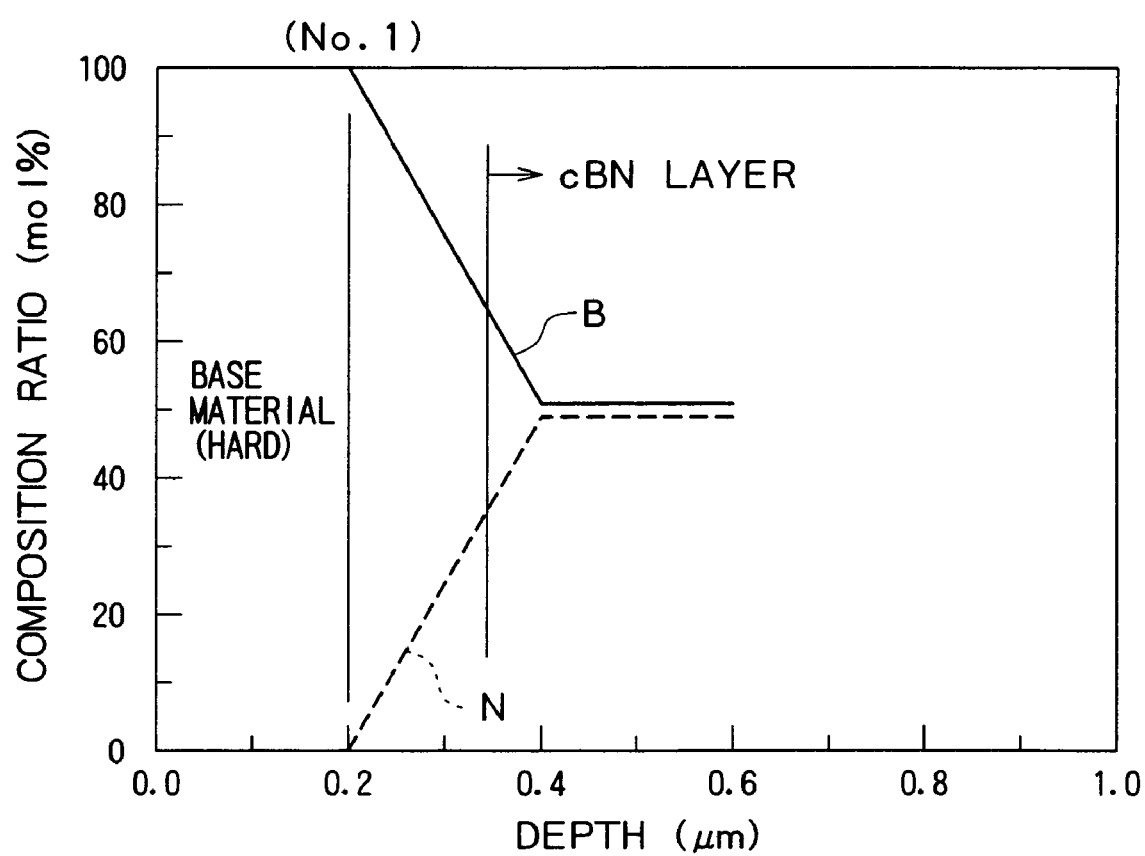
FIG. 10 is a depth profile schematically showing the SIMS analysis results in a hard coating film of No. 1 of Table 2.
Figure 11:
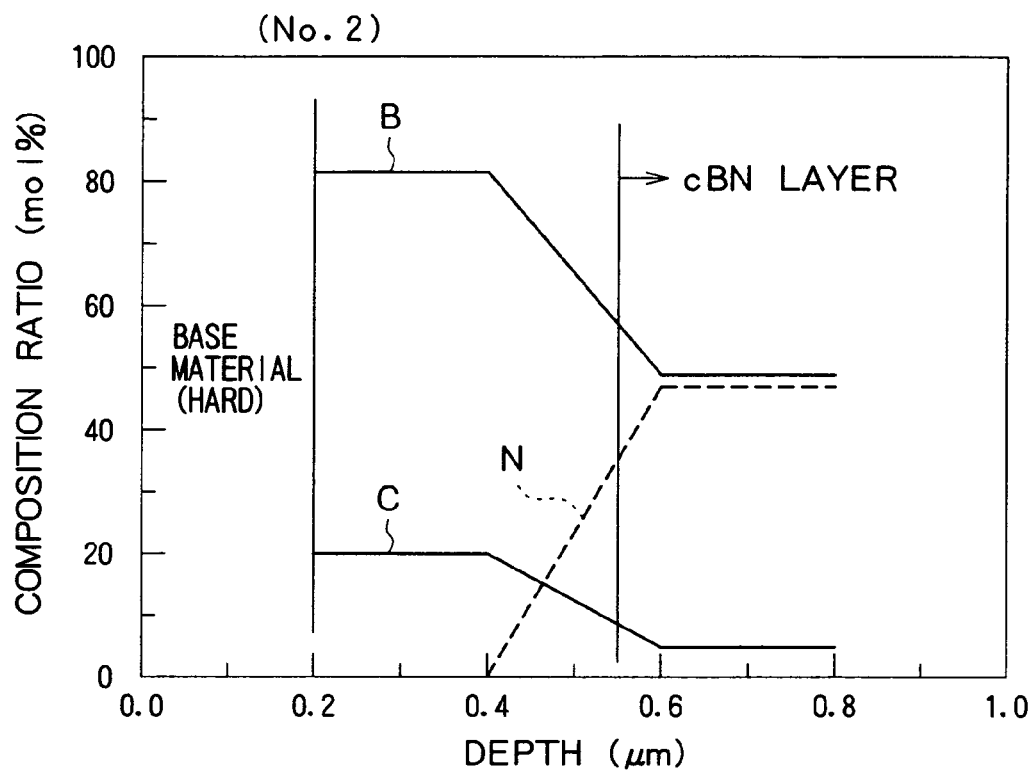
FIG. 11 is a depth profile schematically showing the SIMS analysis results in a hard coating film of No. 2 of Table 2.
Figure 12:
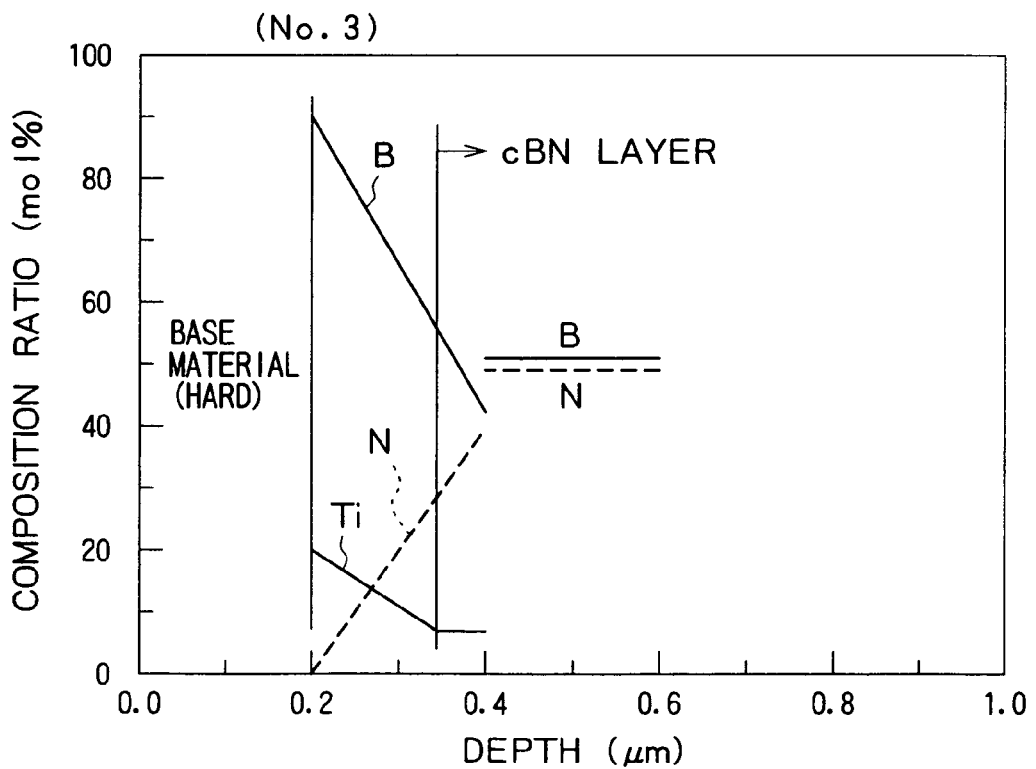
FIG. 12 is a depth profile schematically showing the SIMS analysis results in a hard coating film of No. 3 of Table 1.
Figure 13:
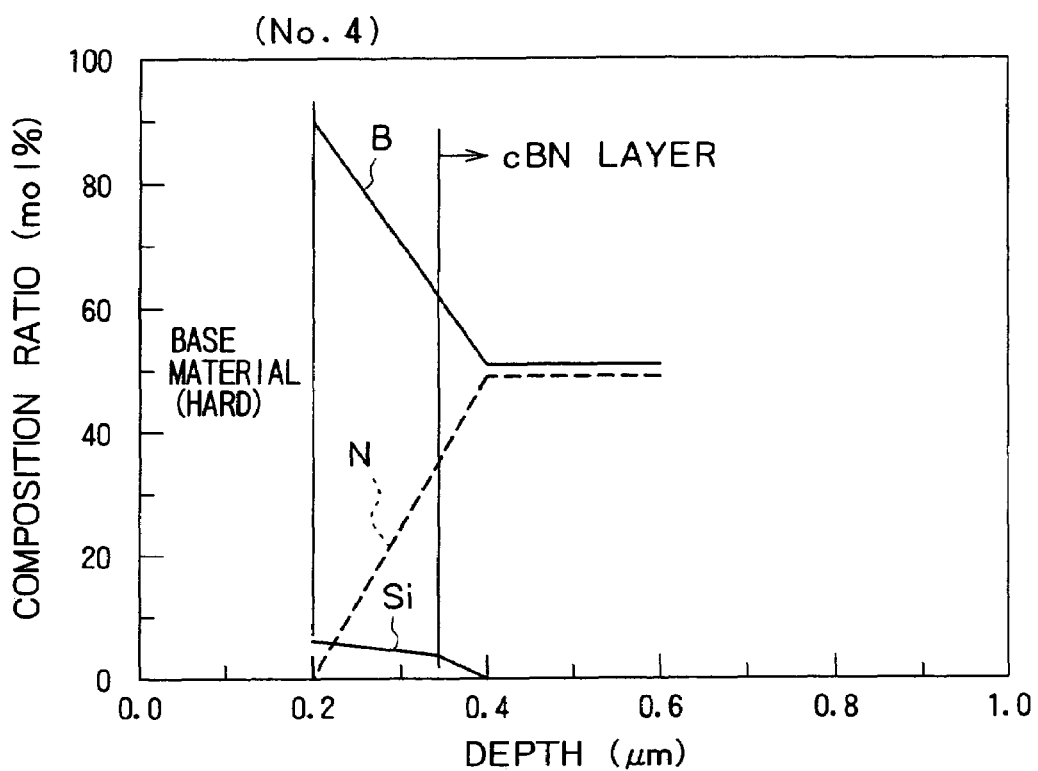
FIG. 13 is a depth profile schematically showing the SIMS analysis results in a hard coating film of No. 4 of Table 2.
Figure 14:
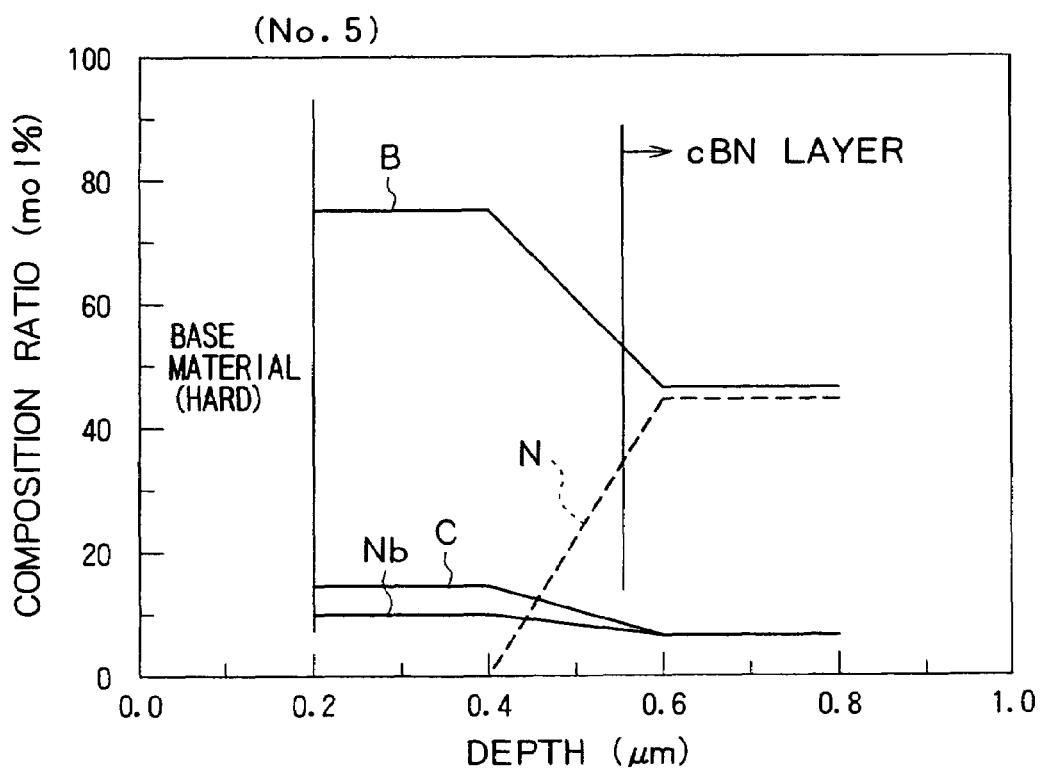
FIG. 14 is a depth profile schematically showing the SIMS analysis results in a hard coating film of No. 5 of Table 2.
Figure 15:
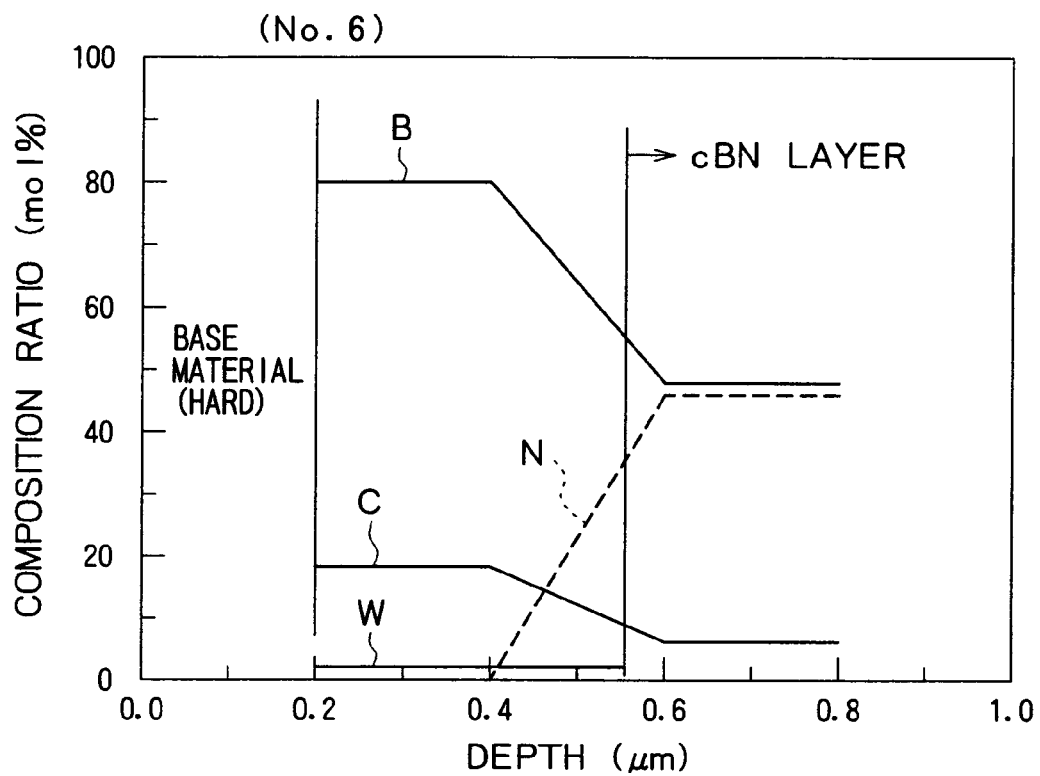
FIG. 15 is a depth profile schematically showing the SIMS analysis results in a hard coating film of No. 6 of Table 2.
Figure 16:
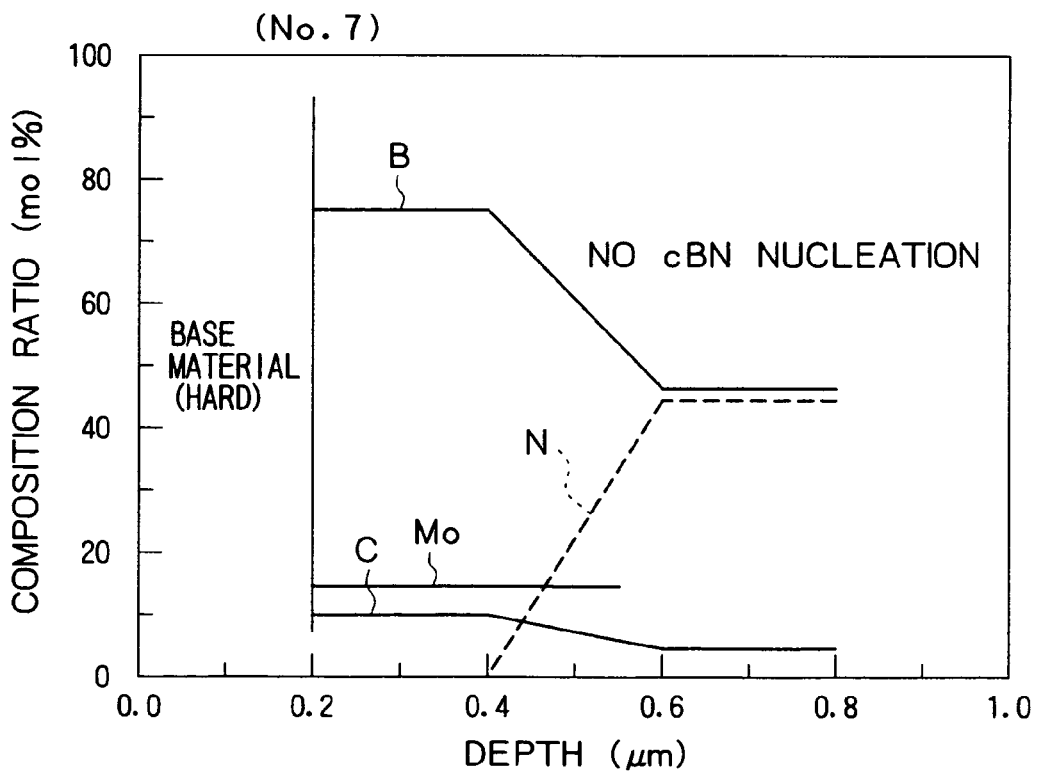
FIG. 16 is a depth profile schematically showing the SIMS analysis results in a hard coating film of No. 7 of Table 2.
Figure 17:
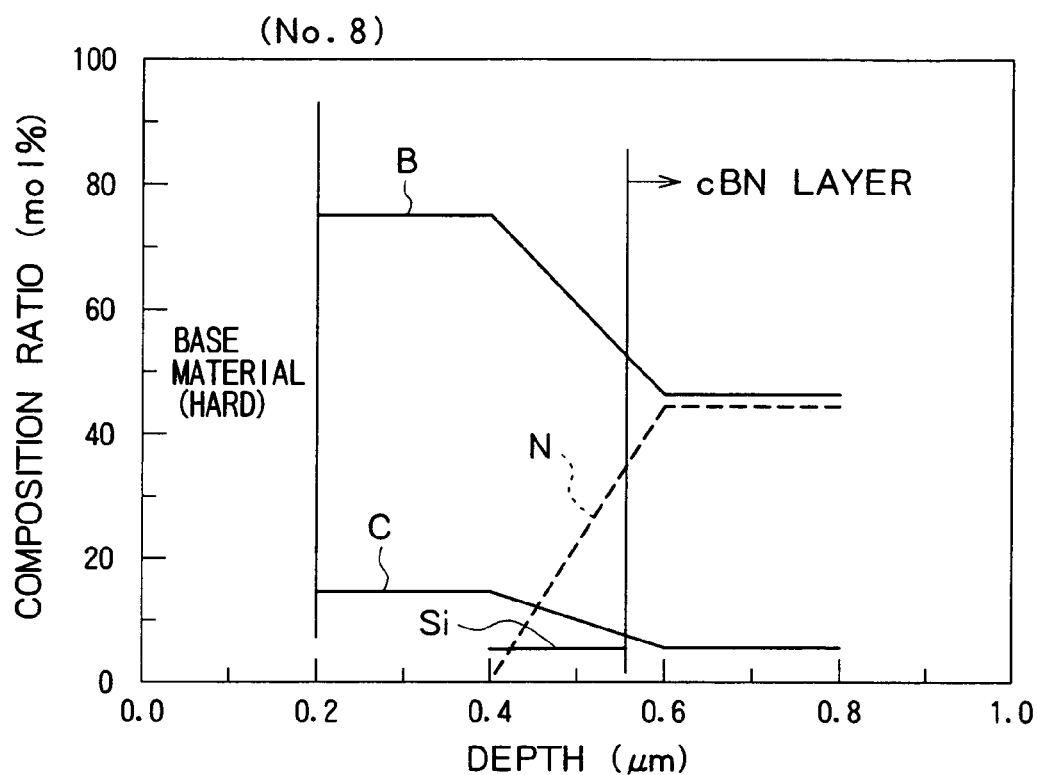
FIG. 17 is a depth profile schematically showing the SIMS analysis results in a hard coating film of No. 8 of Table 2.
Figure 18:
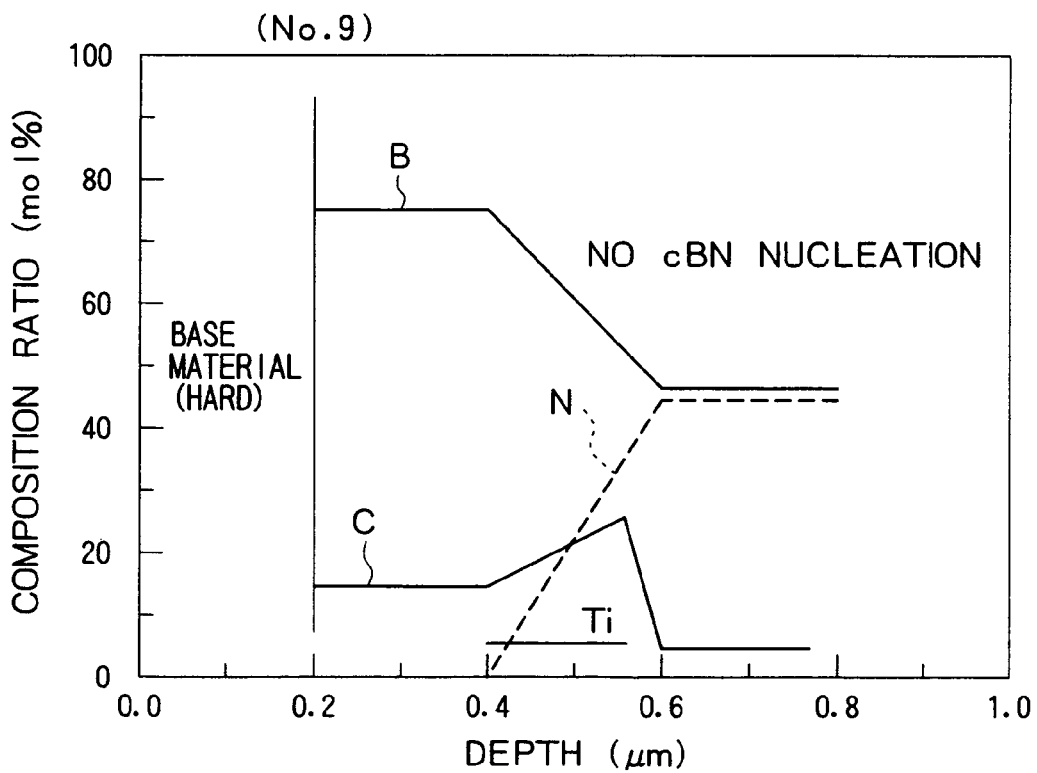
FIG. 18 is a depth profile schematically showing the SIMS analysis results in a hard coating film of No. 9 of Table 2

Each sample shown in Table 1 below was manufactured. In the table, for No. 8 (FIG. 6), a boron target was used in place of the boron carbide target 2, and C was added by a methane gas. For Nos. 10 and 11, the one having a larger boron content than with $B_4C$ was used as the boron carbide target 2.

The adhesion of each sample shown in Table 1 below was evaluated by a scratch test. The scratch test conditions in this case were as described below. Further, the bond state of the metallic elements in the graded composition layer was detected with an XPS (X-ray photoelectron spectroscopy). At this step, the bond proportion was determined as the proportion (the areal ratio of the spectrum) of the metallic elements forming bonds with B, C, and N in the metallic elements added of the B-, and C- (or N-)rich portion of the XPS spectrum. Further, the bond proportion is the average of the measured values at given 3 points in the B-/C-rich layer. These results are shown together in Table 1 below. Incidentally, for the formation of the graded composition layer, a balanced magnetron sputtering process (BMS process) was used for Nos. 3 and 12, and an unbalanced magnetron sputtering process (UBMS process) was used for other samples in Table 1.

(Scratch Test Conditions)

The configuration of each multilayered coating film shown in Table 1 was detected by SIMS (secondary ion mass spectrometry), and the composition distribution along the depth direction was detected. The results are schematically shown in FIGS. 2 to 9, respectively. Incidentally, the term "depth" in FIGS. 2 to 9 denotes the distance toward the surface layer side with the position at a depth of 0.2 μm from the substrate surface as a reference (depth: 0 μm).

From these results, it can be considered as follows. First, Nos. 3 to 13 are the samples of Examples satisfying the requirements defined in the present invention. It is indicated that excellent adhesion of 45 N or more has been achieved for all the samples in the scratch test.

In contrast, Nos. 1 and 2 lack in any of the requirements defined in the present invention. It is indicated that the samples have undergone the degradation of adhesion.

In the configuration of the apparatus shown in FIG. 1, one metal target 1 and one boron carbide ($B_4C$) target 2 are individually arranged. However, the apparatus to be applied to the present invention is not limited to such a configuration. A plurality of the targets 1 and a plurality of the targets 2 can also be arranged respectively in the same vacuum chamber. By depositing a film by means of such an apparatus, it is possible to implement a more compact multilayered structure.

Further, with the foregoing apparatus configuration, film deposition was carried out while rotating a table. Such a configuration is effective for forming the coating film (e.g., metal layer/graded composition layer/B- and C-containing layer) of the configuration of the present invention using the targets containing metallic elements, and B and C. In the present invention, the graded composition layer is formed in the following manner. The different evaporation sources (targets 1 and 2) were simultaneously discharged, and thus, the layer is formed while rotating the substrate. With this configuration, a thin metal layer is formed when the substrate is passing in front of the metal target 1. Whereas, a B- and C-containing film is formed when the substrate is

TABLE 1

| | | | Coating film structure (numerical value is expressed in terms of molar ratio) | | | |
| No. | First layer | Interlayer | Graded composition layer | Surface layer | Metallic element bond | Bond proportion (%) | Adhesion (N) |
| --- | --- | --- | --- | --- | --- | --- | --- |
| 1 | — | — | — | B: 0.8, C: 0.2 | — | — | 10 |
| 2 | Ti | — | — | B: 0.8, C: 0.2 | — | — | 20 |
| 3 | W | — | W—B—C | B: 0.8, C: 0.2 | W—B, W—C | 55 | 45 |
| 4 | Ti | — | Ti—B—C | B: 0.8, C: 0.2 | Ti—B, Ti—C | 75 | 50 |
| 5 | Nb | — | Nb—B—C | B: 0.8, C: 0.2 | Nb—B, Nb—C | 88 | 50 |
| 6 | TiN | — | Ti—B—C—N | B: 0.8, C: 0.2 | Ti—B, Ti—C, Ti—N | 95 | 55 |
| 7 | TaN | — | Ta—B—C—N | B: 0.8, C: 0.2 | Ta—B, Ta—C, Ta—N | 90 | 65 |
| 8 | NbC | — | Nb—B—C | B: 0.8, C: 0.2 | Nb—B, Nb—C | 98 | 70 |
| 9 | Ti | TiN | Ti—B—C—N | B: 0.8, C: 0.2 | Ti—B, Ti—C, Ti—N | 99 | 80 |
| 10 | W | — | W—B—C | B: 0.75, C: 0.15, W: 0.1 | W—B, W—C | >99 | 80 |
| 11 | Ti | TiN | Ti—B—C—N | B: 0.7, C: 0.2, N: 0.1 | Ti—B, Ti—C, Ti—N | >99 | 80 |
| 12 | Nb | — | Nb—B—C | B: 0.8, C: 0.2 | Nb—B, Nb—C | 65 | 45 |
| 13 | Zr | — | Zr—B—C | B: 0.8, C: 0.2 | Zr—B, Zr—C | 95 | 80 |

| | |
| --- | --- |
| Indenter | Diamond (tip diameter: 200 μmR) |
| Load increase rate | 100 N/min |
| Scratch rate | 10 mm/min |
| Load range | 0 to 100 N | passing in front of the B- and C-containing target 2. As a result, a multilayered film is apparently formed. However, in general, evaporated particles by a PVD process such as a sputtering process have an energy, so that interface mixing occurs between the metal layer and the B- and C-containing layer. This results in a roughly uniform film along the depth direction. However, the interface mixing effects have a limit according to the energy. Therefore, it is necessary to control the thickness of the film to be formed when the substrate is passing in front of the evaporation source with precision. The thickness also depends upon the process used, and the voltage to be applied to the substrate (which determines the energy of incident particles). However, it is preferably controlled so as to be generally 10 nm or less. More preferably, it is controlled at 5 nm or less.

EXAMPLE 2

Also in Example 2, the sputtering film deposition apparatus shown in FIG. 1 was also used as with Example 1.

By means of the film deposition apparatus shown in FIG. 1, various hard coating films (first layer/outermost surface layer or first layer/interlayer/multilayered film of the outermost surface layer) were formed on the substrates. At this step, a mirror-polished cemented carbide was used as a substrate for film deposition. The inclusion of metallic elements into the B- and N-containing layer was accomplished by discharging the B-containing target 2 and discharging the metal target 1. Whereas, as sputtering gases, a mixed gas of Ar—$N_2$ was used for adding nitrogen, and a mixed gas of Ar—$N_2$—$CH_4$ was used when C was required to be added. The total pressure was controlled at 0.6 Pa. The electric power inputted to each of the targets 1 and 2 was set at 1.5 kW at the maximum. The substrate bias for the occurrence of the cBN nucleation was −200 V, and other portions underwent film deposition at −100 to −150 V. The substrate temperature was controlled between 200 to 400° C.

Each sample shown in Table 2 below was manufactured. First, a layer of the composition shown as the first layer in the table was formed on a substrate. The thickness of the first layer was about 0.2 µm.

As for the samples (Nos. 1, 3, and 4) each containing nitrogen in the first layer, the nitrogen content in the first layer was increased. At the point where the molar ratio of B and N had reached the region capable of causing the cBN nucleation, cBN nucleation occurred, and subsequently, a cBN film was formed. The layer formed after the cBN nucleation is herein referred to as a surface layer. After the molar ratio of B and N reached 0.5:0.5, film deposition was carried out while keeping the molar ratio. Accordingly, the film composition of the surface layer in the table is such that the molar ratio of B and N is 0.5:0.5. The thickness of the surface layer was set at about 1 µm.

As for the samples each not containing nitrogen in the first layer, the addition of nitrogen was started after the formation of the first layer. The layer formed after the start of addition of nitrogen is herein referred to as an interlayer. The nitrogen content in the interlayer was increased. As a result, for samples Nos. 2, 5, 6, and 8, at the point where the molar ratio of B and N had reached the region capable of causing the cBN nucleation, cBN nucleation occurred, and subsequently, a cBN film was formed. The layer formed after the cBN nucleation is herein referred to as the surface layer. After the molar ratio of B and N had become an even ratio, a film was deposited while keeping the molar ratio. The film composition of the surface layer at this step is shown in the table. In this case, the thickness of the interlayer was about 0.2 µm. The thickness of the surface layer was set at 1 µm. As for samples Nos. 7 and 9, it was not possible to effect cBN nucleation. Nonetheless, after the molar ratio of B and N had become an even ratio, film deposition was carried out while keeping the molar ratio.

The adhesion of each sample was evaluated by a scratch test. The scratch test conditions in this case were as described below. Further, the metal composition at the nucleation point, the bond state of the metallic elements in the layer, and the like were detected with an XPS (X-ray photoelectron spectroscopy). Further, the hardness in each layer was measured with a nanoindentation method. For the measurements at this step, a triangular pyramid indenter (Bercovici type) was used as an indenter. Thus, the measurements were carried out under a load of 0.98 mN. As for each layer having a gradient composition distribution, the hardness at a portion having the average composition was measured. These results are shown together in Table 1 below. As for each sample in which it had not been possible to effect cBN nucleation, the hardness of the outermost surface layer was measured. The measured hardness value is described in the column for the surface layer hardness, and the metal composition of the interlayer is described in the column for the nucleated metal composition. However, the adhesion was not evaluated.

(Scratch Test Conditions)

TABLE 2

| No. | First layer | First layer hardness (GPa) | Interlayer | Interlayer hardness (GPa) | Surface layer | Surface layer hardness (GPa) | Metal composition at nucleation point | Metallic element bond | Adhesion (N) |
|---|---|---|---|---|---|---|---|---|---|
| 1 | B—N | 10 | — | — | B: 0.5, N: 0.5 | 55 | 0 | | 10 |
| 2 | B: 0.8, C: 0.2 | 35 | B—C—N | 22 | B: 0.475, N: 0.475, C: 0.05 | 55 | 0 | | 40 |
| 3 | B—N—Ti | 30 | — | — | B: 0.5, N: 0.5 | 55 | 0.08 | Ti—B, Ti—N | 49 |
| 4 | B—N—Si | 33 | — | — | B: 0.5, N: 0.5 | 55 | 0.05 | Si—B—, Si—N | 55 |
| 5 | B: 0.77, C: 0.15, Nb: 0.07 | 38 | B—N—C—Nb | 38 | B: 0.475, N: 0.475, C: 0.05 | 55 | 0.07 | Nb—B, Nb—B, Nb—C | 67 |

TABLE 2-continued

| No. | First layer | First layer hardness (GPa) | Interlayer | Interlayer hardness (GPa) | Surface layer | Surface layer hardness (GPa) | Metal composition at nucleation point | Metallic element bond | Adhesion (N) |
|---|---|---|---|---|---|---|---|---|---|
| 6 | B: 0.8, C: 0.19, W: 0.01 | 38 | B—N—C—W | 22 | B: 0.475, N: 0.475, C: 0.05 | 55 | 0.01 | W—B, W—B, W—C | 40 |
| 7 | B: 0.75, C: 0.1, Nb: 0.15 | 39 | B—N—C—Mo | 37 | No cBN nucleation | 15 | 0.15 | Mo—B, Mo—N, No—C | Unevaluatable |
| 8 | B: 0.8, C: 0.2 | 35 | B—N—C—Si | 40 | B: 0.475, N: 0.475, C: 0.05 | 55 | 0.05 | Si—B, Si—C, Si—N | 75 |
| 9 | B: 0.8, C: 0.2 | 35 | B—N—C—Ti | 25 | No cBN nucleation | 15 | 0.25 (C) | Ti—B, Ti—N, Ti—C | Unevaluatable |

Indenter: Diamond (tip diameter: 200 μmR
Load increase rate: 100 N/min
Scratch rate: 10 mm/min
Load range: 0 to 100 N The configuration of each multilayered coating film shown in Table 2 was detected by SIMS (secondary ion mass spectrometry), and the composition distribution along the depth direction was detected. The results are schematically shown in FIGS. 10 to 18, respectively. Incidentally, the term "depth" in FIGS. 10 to 18 denotes the distance toward the surface layer side with the position at a depth of 0.2 μm from the substrate surface as a reference (depth: 0 μm).

In the diagram, for each sample in which cBN nucleation occurred, the position of nucleation is shown. The term "nucleation portion" referred to in the present invention denotes the portion immediately before the nucleation site, i.e., immediately to the left of the nucleation site shown. In the present invention, the composition of this portion matters.

From these results, it can be considered as follows. First, Nos. 3 to 5, and 8 are the samples of Examples satisfying the requirements defined in the present invention. It is indicated that excellent adhesion has been achieved for all the samples in the scratch test. It is indicated that the hardness of each interlayer (or the first layer when there is no interlayer) is high in these samples. As a result, the value of adhesion also becomes high.

In contrast, Nos. 1, 2, 6, 7, and 9 lack in any of the requirements defined in the present invention. It is indicated that the samples have undergone the degradation of adhesion. It can be considered that nucleation has not been effected because of the excessive molar ratio of the metal (W) in the interlayer for No. 7, or precipitation of C—N bonds caused by the excessive molar ratio of C for No. 9.

Incidentally, with the configuration of the apparatus shown in FIG. 1, one metal target 1 and one boron carbide (B$_4$C) target 2 are respectively arranged. However, the apparatus to be applied to the present invention is not limited to such a configuration. A plurality of the targets 1 and a plurality of the targets 2 can also be arranged respectively in the same vacuum chamber. By depositing a film by means of such an apparatus, it is possible to implement a more compact multilayered structure.

Further, for carrying out the present invention with the foregoing apparatus configuration, a film is deposited while rotating a table (i.e., rotating the substrate). Such a configuration is also effective for forming the coating film with the configuration of the present invention. In the present invention, coating film formation is carried out while simultaneously discharging the different evaporation sources (targets 1 and 2). Thus, by rotating the substrate, a thin metal layer is formed when the substrate is passing in front of the metal target 1. Whereas, a B- and C-containing film is formed when the substrate is passing in front of the B- and C-containing target 2. As a result, a multilayered film is apparently formed. However, in general, evaporated particles by a PVD process such as a sputtering process have an energy, so that interface mixing occurs between the metal layer and the B- and N-containing layer. This results in a roughly uniform film along the depth direction. However, the interface mixing effects have a limit according to the energy. Therefore, it is necessary to control the thickness of the film to be formed when the substrate is passing in front of the evaporation source with precision. The thickness also depends upon the process used, and the voltage to be applied to the substrate (which determines the energy of incident particles). However, it is preferably controlled so as to be generally 10 nm or less. More preferably, it is controlled at 5 nm or less.

What is claimed is:

1. A hard coating film excellent in adhesion to be formed on a substrate, comprising stacked layers including at least the following layers (1) to (3):
    (1) a first layer on the substrate side comprising one or more metals selected from the group consisting of elements in Groups 4A, 5A, and 6A of the periodic table;
    (2) a B- and C-containing surface layer; and
    (3) a graded composition layer that is formed in a sandwiched manner between the first layer and the surface layer, and has a thickness of 0.05 μm or more, and in which the content of B and C changes continuously or stepwise from the first layer side toward the surface layer side, wherein a bond between one or more elements selected from the group consisting of elements in Groups 4A, 5A, and 6A of the periodic table, and at least any of B, C, and N is contained in the graded composition layer.

2. The hard coating film according to claim 1, wherein at least one of layers of a nitride and a carbonitride of one or more metals selected from the group consisting of elements in Groups 4A, 5A, and 6A of the periodic table is further interposed between the first layer and the graded composition layer.

3. The hard coating film according to claim 1, wherein the ratio of C to B in the surface layer is 0.1 to 0.3 on a mole basis.

4. The hard coating film according to claim 1, wherein one or more elements selected from the group consisting of elements in Groups 4A, 5A, and 6A of the periodic table, Si, Al, and N are contained in a proportion of 0.02 to 0.5 mol in the surface layer.

5. A method for manufacturing a multilayer type hard coating film excellent in adhesion according to claim 1, comprising: arranging at least one target of one or more metals selected from the group consisting of elements in Groups 4A, 5A, and 6A of the periodic table, or an alloy thereof, and at least one B- and C-containing target in the same vacuum chamber, and thus applying a sputtering process while rotating the substrate, thereby to form the hard coating film on the substrate surface.

6. A hard coating film excellent in adhesion to be formed on a substrate, comprising stacked layers including at least the following layers (1) to (3):
  (1) a first layer on the substrate side comprising a layer of a nitride and/or a carbonitride of one or more metals selected from the group consisting of elements in Groups 4A, 5A, and 6A of the periodic table;
  (2) a B- and C-containing surface layer; and
  (3) a graded composition layer that is formed in a sandwiched manner between the first layer and the surface layer, and has a thickness of 0.05 µm or more, and in which the content of B and C changes continuously or stepwise from the first layer side toward the surface layer side, wherein a bond between one or more elements selected from the group consisting of elements in Groups 4A, 5A, and 6A of the periodic table, and at least any of B, C, and N is contained in the graded composition layer.

7. The hard coating film according to claim 6, wherein the ratio of C to B in the surface layer is 0.1 to 0.3 on a mole basis.

8. The hard coating film according to claim 6, wherein one or more elements selected from the group consisting of elements in Groups 4A, 5A, and 6A of the periodic table, Si, Al, and N are contained in a proportion of 0.02 to 0.5 mol in the surface layer.

9. A method for manufacturing a multilayer type hard coating film excellent in adhesion according to claim 6, comprising: arranging at least one target of one or more metals selected from the group consisting of elements in Groups 4A, 5A, and 6A of the periodic table, or an alloy thereof, and at least one B- and C-containing target in the same vacuum chamber, and thus applying a sputtering process while rotating the substrate, thereby to form the hard coating film on the substrate surface.

10. A hard coating film excellent in adhesion, comprising: a cubic boron nitride film as an outermost surface layer: and a B- and N-containing layer, the cubic boron nitride film being stacked in a state of having been nucleated from the B- and N-containing layer, and the B- and N-containing layer having a ratio of N to B of 0.8 to 1 on a mole basis at least in the nucleation portion, and containing one or more elements selected from the group consisting of elements in Groups 4A, 5A, and 6A, and Si in a proportion of 0.02 to 0.1 on a molar ratio basis, wherein the hard coating film contains C in a proportion of 0.2 or less on a mole basis in at least the nucleation portion.

11. The hard coating film according to claim 10, wherein a bond between one or more elements selected from the group consisting of elements in Groups 4A, 5A, and 6A of the periodic table, and Si, and at least any of B and N is contained in the B- and N-containing layer.

12. The hard coating film according to claim 10, formed on a B- and C-containing film formed on a substrate.

13. The hard coating film excellent in adhesion according to claim 12, wherein the B- and C-containing film provided on the substrate comprises stacked layers including at least the following layers (1) to (3):
  (1) a first layer on the substrate side comprising one or more metals selected from the group consisting of elements in Groups 4A, 5A, and 6A of the periodic table;
  (2) a B- and C-containing surface layer; and
  (3) a graded composition layer that is formed in a sandwiched manner between the first layer and the surface layer, and has a thickness of 0.05 µm or more, and in which the content of B and C changes continuously or stepwise from the first layer side toward the surface layer side.

14. The hard coating film excellent in adhesion according to claim 12, wherein the B- and C-containing film provided on the substrate comprises stacked layers including at least the following layers (1) to (3):
  (1) a first layer on the substrate side comprising a layer of a nitride and/or a carbonitride of one or more metals selected from the group consisting of elements in Groups 4A, 5A, and 6A of the periodic table;
  (2) a B- and C-containing surface layer; and
  (3) a graded composition layer that is formed in a sandwiched manner between the first layer and the surface layer, and has a thickness of 0.05 µm or more, and in which the content of B and C changes continuously or stepwise from the first layer side toward the surface layer side.

15. A method for manufacturing a multilayer type hard coating film excellent in adhesion according to claim 10, comprising: arranging at least one target of one or more metals selected from the group consisting of elements in Groups 4A, 5A, and 6A of the periodic table, and Si or an alloy thereof, and at least one B- and C-containing target in the same vacuum chamber, and thus applying a sputtering process, thereby to form the hard coating film on the substrate surface.

* * * * *

UNITED STATES PATENT AND TRADEMARK OFFICE
CERTIFICATE OF CORRECTION

PATENT NO. : 7,264,883 B2 Page 1 of 1
APPLICATION NO. : 10/743735
DATED : September 4, 2007
INVENTOR(S) : Yamamoto et al.

It is certified that error appears in the above-identified patent and that said Letters Patent is hereby corrected as shown below:

On the title page, Item (73), the Assignee information is incorrect. Item (73) should read:

-- Assignee: Kabushiki Kaisha Kobe Seiko Sho (Kobe Steel, Ltd.), Kobe-shi (JP) --

Signed and Sealed this

Twenty-seventh Day of November, 2007

JON W. DUDAS
*Director of the United States Patent and Trademark Office*